United States Patent
Takahashi et al.

(10) Patent No.: US 6,362,433 B1
(45) Date of Patent: Mar. 26, 2002

(54) FLEXIBLE PRINTED CIRCUIT BOARD

(75) Inventors: Satoshi Takahashi; Akira Tsutsumi; Noriaki Kudo; Akihiro Arai; Koji Arai; Koichi Uno; Satoshi Oaku; Osamu Ichihara; Hiromasa Ota, all of Tochigi (JP)

(73) Assignee: Sony Chemicals Corporation, Tokyo (JP)

( * ) Notice: Subject to any disclaimer, the term of this patent is extended or adjusted under 35 U.S.C. 154(b) by 0 days.

(21) Appl. No.: 09/326,275

(22) Filed: Jun. 4, 1999

(30) Foreign Application Priority Data

Jun. 5, 1998 (JP) .......................... 10-157962

(51) Int. Cl.[7] .................................. H05K 1/03
(52) U.S. Cl. .................. 174/255; 174/256; 174/259
(58) Field of Search .................. 174/254, 255, 174/256, 259

(56) References Cited

U.S. PATENT DOCUMENTS

| | | | | |
|---|---|---|---|---|
| 4,781,969 A | * | 11/1988 | Kobayashi et al. | 428/209 |
| 4,937,133 A | * | 6/1990 | Watanabe et al. | 428/209 |
| 5,493,074 A | * | 2/1996 | Murata et al. | 174/254 |
| 5,633,480 A | * | 5/1997 | Sato et al. | 174/255 |
| 5,723,205 A | * | 3/1998 | Millette et al. | 428/209 |

* cited by examiner

Primary Examiner—Albert W. Paladini
Assistant Examiner—José H. Alcalá
(74) Attorney, Agent, or Firm—Jay H. Maioli

(57) ABSTRACT

A flexible printed circuit board that is intended to minimize curling is formed having a first polyimide-resin layer with a conductor pattern formed on one surface thereof and supporting that conductor pattern. A second polyimide-resin is formed on another surface of the conductor pattern and covers and protects the circuit of the conductor pattern. The polyimide-resin layers are chosen so that a difference between a coefficient of linear thermal expansion of the first polyimide-resin layer and the coefficient of linear thermal expansion of the second polyimide-resin layer is $3 \times 10^{-6}$/K or smaller.

5 Claims, 6 Drawing Sheets

FLEXIBLE PRINTED CIRCUIT BOARD

BACKGROUND OF THE INVENTION

1. Field of the Invention

The present invention relates to a flexible printed circuit board for establishing the electrical connection in, for example, an electronic apparatus. More particularly, the present invention relates to a flexible printed circuit board which incorporates a conductor, such as copper foil which is directly applied with polyimide resin, and which has an insulating protective layer made of the polyimide resin and formed thereon.

2. Description of the Related Art

To reduce the size and cost of a so-called portable electric product, such as a portable recording/reproducing apparatus, the flexible printed circuit board is usually employed. The flexible printed circuit board establishes the connection among the electric circuits to one another, the flexible printed circuit board being a relatively low cost board which permits space saving.

In the industrial field of the flexible printed circuit boards, there are requirements for reducing the sizes of the electronic apparatuses and permitting a multiplicity of functions to be provided. Therefore, techniques have rapidly been progressed, the techniques including raising of the mounting density of the circuits, surface mounting which uses wire bonding, direct mounting of a semiconductor chip and packaging. Therefore, the shape of the flexible printed circuit board becomes more complicated. Moreover, small circuits for use in the dense mounting process have been required.

The conventional flexible printed circuit board incorporates a circuit formed by etching a flexible printed board which is a base board. Then, an insulating protective layer (a cover layer) is formed to protect the circuit.

The flexible printed circuit board, which is the base board, for use in the flexible printed circuit board usually incorporates polyimide films because of their satisfactory flexibility and heat resistance. The flexible printed board is exemplified by a triple-layer flexible printed board constituted by bonding a polyimide film and a copper foil, which is a conductor, to each other through a heat-resisting adhesive.

However, the foregoing triple-layer flexible printed board suffers from unsatisfactory heat resistance of the adhesive. Thus, the adhesive is easily deformed owing to heat. Therefore, heat hysteresis, such as heat crimping, which is performed when a bonding process is performed by using the adhesive causes warp or curl of the board to occur. As a result, there arises problems in that a small circuit pattern cannot easily be formed and that surface mounting which uses wire bonding cannot easily be performed.

To overcome the problems experienced with the triple-layer flexible printed board, a double-layer flexible printed board 53 has been suggested and put into practical use. As shown in FIG. 1, no adhesive is employed and polyamic acid, which is a precursor for the polyimide, is directly applied to the surface of metal foil 51 made of copper or the like. Then, the polyamic acid is dried, and then it is turned into an imide so that a polyimide resin layer 52 is laminated so that the double-layer flexible printed board 53 is manufactured. A flexible printed circuit board 50 incorporating the double-layer flexible printed board 53, as shown in FIG. 2, has a circuit formed thereon. Moreover, an insulating protective layer 54 is formed on the circuit. In FIG. 2, a portion of the metal foil 51 which is not coated with the insulating protective layer 54 and which is exposed to the outside is a portion which will be formed into a terminal.

Also the double-layer flexible printed board 53 must be subjected to a high-temperature process in which the polyamic acid applied to the surface of the metal foil 51 is turned into an imide. Although the polyimide resin layer 52 having heat resistance superior to that of the foregoing adhesive is employed, the difference between the coefficient of linear thermal expansion of the metal foil 51 and that of the polyimide resin layer 52 causes the following difference. That is, the thermal contraction ratio becomes different between the metal foil 51 and the polyimide resin layer 52 after the temperature has been lowered to room temperature. Thus, a curl is undesirably formed. If the double-layer flexible printed board 53 is curled, an accuracy of the interval between conductors of the circuit deteriorates after the etching process has been performed. What is worse, mounting of elements cannot easily be performed.

Therefore, a method of preventing the curl of the double-layer flexible printed board has been suggested. The method has the step of specifying the chemical structure of the polyimide to be formed. To minimize the coefficient of linear thermal expansion of the polyimide resin, a method has been suggested with which the structure of the polyamic acid, which is the precursor, is specified.

However, either of the methods of preventing the curl of the double-layer flexible printed board cannot easily completely prevent the curl. When the circuit has been formed by etching the metal foil, the curl cannot be removed.

The foregoing conventional methods have been adapted to the double-layer flexible printed board 53, which is the base board on which the insulating protective layer 54 has not been formed. Therefore, no investigation has been made about the flexible printed circuit board 50 which incorporates the double-layer flexible printed board 53 and the insulating protective layer 54 for the circuit which are integrated with each other.

The industrial field of the flexible printed circuit boards have recently be required to be technically progressed to realize, for example, dense mounting. Since the semiconductor chip is mounted by using soldering, the required performance of the flexible printed circuit board can satisfactorily be realized when the flexible printed board and the insulating protective layer for the circuit are considered as one device. Therefore, prevention of the curl of the double-layer flexible printed board 53 is insufficient to realize the performance. As a result, a state of the flexible printed circuit board 50 incorporating the insulating protective layer 54 mounted integrally must be investigated.

The insulating protective layer 54 (the cover layer) for use in the flexible printed circuit board 50 must have heat resistance. Therefore, the insulating protective layer 54 is usually made of the polyimide material. The insulating protective layer 54 can be formed by a printing method or a film method.

The printing method employs a step similar to a step which is performed with a hard printing plate to print resist ink by using a silk screen. Since the resist ink is mainly composed of epoxy resin, the foregoing method has a problem of unsatisfactory flexibility. If the resist is not selected in sufficient consideration of the thermal expansion ratio of the resist, the flexible printed circuit board undesirably encounters a curl. Since solvent having a high polarity and contained in the polyimide resist ink absorbs water in the atmosphere, satisfactory printing workability cannot be realized. Thus, there arises a problem in that the thicknesses of the films cannot easily be administered.

On the other hand, the film method has the steps of forming apertures in portions corresponding to the land portions and terminal portions by using a die or a punch. Then, a polyimide film applied with an adhesive and a flexible printed board having a circuit formed thereon are bonded to each other by heat crimping or the like. Thus, a flexible printed circuit board is manufactured.

The foregoing method, however, encounters difficulty in forming fine land portions and terminal portions though the accuracy of the die or the like is improved. Moreover, the method has a problem in that leakage of the adhesive contaminates the fine circuit. When the flexible printed circuit board is mounted on the semiconductor chip or the like, the flexible printed circuit board must have flatness. When the insulating protective layer is formed, dispersion of the thicknesses of the insulating protective layers causes partial contraction or a curl to occur. As a result, the flatness deteriorates and undesirable contraction takes place between the conductors. Recently, a circuit has been required which has a structure that the insulation between conductors of a fine circuit in the terminal portion or the like, that is, insulation between adjacent conductors is realized by embedding an insulating protective layer between the conductors. In the foregoing case, severe dimension stability between the conductors is required. The conventional technique cannot meet the foregoing requirement.

As described above, the flexible printed circuit board 50 has problems when the insulating protective layer 54 is formed. The problems include curl caused from incorrect selection of the resist, separation of the resist, resistance against breakage, leakage of the adhesive, insufficient bonding force and deterioration in the dimension accuracy.

SUMMARY OF THE INVENTION

In view of the foregoing, an object of the present invention is to provide a flexible printed circuit board which is capable of preventing a curl, exhibiting excellent dimension stability and having high performance and which is adaptable to a fine and dense circuit required to reduce the size and increase the function of an electronic apparatus.

To achieve the above-mentioned object, according to one aspect of the present invention, there is provided a flexible printed circuit board comprising: a conductor patterned to correspond to a circuit; a first polyimide-resin layer formed on either surface of the conductor and capable of supporting the conductor; and a second polyimide-resin layer formed on another surface of the conductor and capable of covering and protecting the circuit, wherein the difference between the coefficient of linear thermal expansion of the first polyimide-resin layer and the coefficient of linear thermal expansion of the second polyimide-resin layer is $3 \times 10^{-6}$/K or smaller.

The flexible printed circuit board according to the present invention incorporates the first polyimide-resin layer and the second polyimide-resin layer which are formed by applying polyamic acid, which is a precursor for the polyimide resin, and by turning the polyamic acid into an imide.

As described above, the flexible printed circuit board according to the present invention has the structure that the difference in the coefficient of linear thermal expansion between the first polyimide-resin layer and the second polyimide-resin layer is optimized. Therefore, the thermal expansion of the two polyimide resin layer formed across the conductor are made to be the same as much as possible. As a result, the flexible printed circuit board according to the present invention is able to prevent a curl and maintain satisfactory flatness if the flexible printed circuit board is subjected to a process, such as a heating process.

Moreover, the flexible printed circuit board according to the present invention incorporates the second polyimide-resin layer which is formed by applying the polyamic acid. Therefore, the flexible printed circuit board according to the present invention is free from problems, such as curl caused from incorrect selection of the resist, separation of the resist, poor resistance against breakage, leakage of the adhesive, insufficient bonding force and deterioration in the dimension accuracy. Therefore, occurrence of a curl can efficiently be prevented and satisfactory flatness can be maintained.

Other objects, features and advantages of the invention will be evident from the following detailed description of the preferred embodiments described in conjunction with the attached drawings.

DESCRIPTION OF THE PREFERRED EMBODIMENTS

Embodiments of the present invention will now be described with reference to the drawings. Although a oneside-access flexible printed circuit board will now be described as an example, the present invention is not limited to this. The flexible printed circuit board according to the present invention is required to be a flexible printed circuit board having polyimide resin layers formed on a conductor on which a circuit has been formed. That is, the flexible printed circuit board according to the present invention is required to be a flexible printed circuit board having a protective layer.

Figure 1:
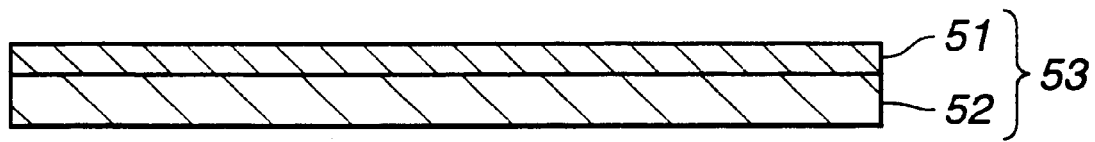
FIG. 1 is a cross sectional view showing an example of a conventional double-layer flexible printed board; according to Prior Art.
Figure 2:
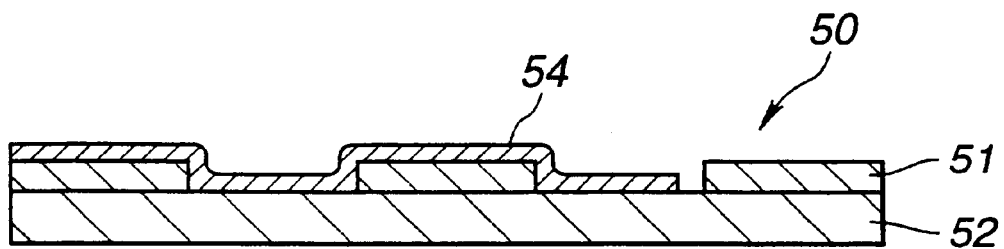
FIG. 2 is a cross sectional view showing an example of a conventional flexible printed circuit board having a protective layer; according to Prior Art.
Figure 3:
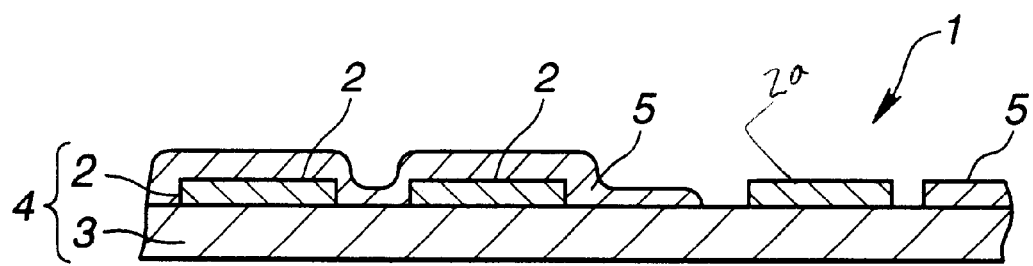
FIG. 3 is a cross sectional view showing an embodiment of a flexible printed circuit board having a protective layer according to the present invention.
Figure 4:
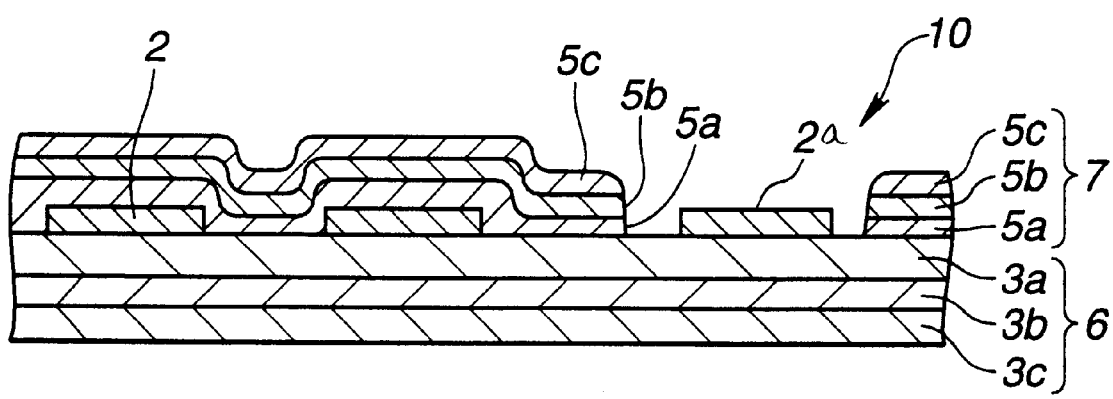
FIG. 4 is a cross sectional view showing another embodiment of the flexible printed circuit board having a protective layer according to the present invention.

FIG. 3 is a cross sectional view showing an embodiment of the flexible printed circuit board 1 having the protective layer. FIG. 4 is a cross sectional view showing another embodiment of the flexible printed circuit board 1 having the protective layer according to the present invention.

The flexible printed circuit board 1 having the protective layer according to the present invention, as shown in FIG. 3, incorporates a flexible printed circuit board 4 which is formed on either surface of copper foil 2 patterned to correspond to a circuit and on which a first polyimide-resin layer 3 has been formed; and a second polyimide-resin layer 5 serving as an insulating protective layer, formed on the copper foil 2 of the flexible printed circuit board 4 and capable of covering and protecting the circuit. Note that a portion 2a of the copper foil 2 shown in FIG. 3 is a portion which will be formed into a terminal portion.

The copper foil 2 is previously patterned to correspond to the circuit. The copper foil 2 is supported by the first polyimide-resin layer 3 and having the circuit covered and protected by the second polyimide-resin layer 5. Note that the copper foil 2 has a characteristic that its coefficient of linear thermal expansion is enlarged when it is heated to 250° C. to 400° C. The foregoing temperature is a temperature at which the polyimide resin constituting the first and second polyimide resin layers 3 and 5 is turned into an imide. The coefficient of linear thermal expansion of the copper foil 2 before the imidation is $16.0 \times 10^{-6}$/K to $18.0 \times 10^{-6}$/K. After the imidation has been completed, the coefficient of linear thermal expansion is $18.0 \times 10^{-6}$/K to $20.0 \times 10^{-6}$/K.

The copper foil 2 may be electrolytic copper foil or rolled copper foil. The thickness of the copper foil 2 is 35 μm or smaller. It is preferable that the thickness is 8 μm to 18 μm to form a precise circuit. If the thickness of the copper foil 2 is 18 μm or larger, the precise circuit cannot easily be formed. If the thickness of the copper foil 2 is 8 μm or smaller, creases inhibiting a smooth coating process are formed.

It is ideal that the copper foil 2 is copper foil which does not require surface treatment. If the copper foil 2 is subjected to the surface treatment using zinc or chrome or using oxidation, the average roughness Ra on the central line must be 10 μm or smaller, preferably 7 μm or smaller.

The metal conductor contained in the flexible printed circuit board according to the present invention is not limited to the copper foil 2. The metal conductor must have a coefficient of linear thermal expansion similar to that of the first and second polyimide resin layers 3 and 5. Moreover, copper foil subjected to a matting process, nickel or zinc plating or oxidation to enlarge the bonding strength may be employed. In addition, the copper foil may be subjected to chemical surface treatment using aluminum alcoholate, aluminum chelate, silane coupling material or imidazole.

The first polyimide-resin layer 3 according to the present invention is formed by applying, to the surface of the copper foil 2, solution mainly composed of polyamic acid which is a condensation compound of acid dihydrate, which is a precursor for the polyimide resin, and aromatic diamine. Then, the polyamic acid solution is dried so as to be turned into an imide. Thus, the first polyimide-resin layer 3 can be formed.

The second polyimide-resin layer 5 according to the present invention serves as an insulating protective layer for protecting the circuit patterned on the copper foil 2 by etching. Similarly to the second polyimide-resin layer 5, the second polyimide-resin layer 5 is formed by applying, to the surface of the flexible printed circuit board 4, solution mainly composed of polyamic acid which is a condensation compound of acid dihydrate, which is a precursor for the polyimide resin, and aromatic diamine. Then, the solution is dried, and then the terminal portion is formed by etching. Then, the solution is turned into an imide.

The flexible printed circuit board 1 having the protective layer according to the present invention is arranged as follows; the difference in the coefficient of linear thermal expansion between the polyimide resin for forming the first polyimide-resin layer 3 and the polyimide resin for forming the second polyimide-resin layer 5 is $3 \times 10^{-6}$/K or smaller. If the difference in the coefficient of linear thermal expansion between the polyimide resin for constituting the first polyimide-resin layer 3 and the polyimide resin for constituting the second polyimide-resin layer 5 is larger than $3 \times 10^{-6}$/K, a curl is easily formed.

As described above, the flexible printed circuit board 1 having the protective layer has the structure that the difference between the coefficients of thermal expansion of the first and second polyimide resin layers 3 and 5 formed across the copper foil 2 is optimized. Therefore, the thermal expansion of the two polyimide resin layers 3 and 5 formed across the copper foil 2 is made to be the same as much as possible. Thus, the flexible printed circuit board 1 having the protective layer according to the present invention has satisfactory flatness because formation of a curl can be prevented significantly even if the flexible printed circuit board 1 having the protective layer is subjected to the heating process, such as the imidation. As a result, a satisfactory quality can be obtained because excellent heat resistance can be realized and a precise circuit can accurately be formed.

When only prevention of the curl is considered, it is preferable that the flexible printed circuit board having the protective layer has the structure that the first and second polyimide resin layers 3 and 5 are made of the same material. When soldering of the semiconductor chip and a mounting process using an anisotropic conductive film are considered, the purposes of the first polyimide-resin layer 3 and the second polyimide-resin layer 5 are sometimes inverted. Moreover, the second polyimide-resin layer 5 must be etched with alkali solution as described later. Therefore, the first polyimide-resin layer 3 and the second polyimide-resin layer 5 must sometimes be made of different materials. It is preferable that the first and second polyimide resin layers 3 and 5 are made of the same polyamic acid from a viewpoint of preventing the curl. However, the polyimide resin for constituting the second polyimide-resin layer 5 must sometimes be determined in accordance with the difference in the thermal expansion ratio from the polyimide resin for constituting the first polyimide-resin layer 3.

As described above, the second polyimide-resin layer 5 is formed by applying the polyamic acid. Therefore, the following problems experienced with the conventional method using the adhesive or the resist can be prevented. That is, the following problems can be prevented: a curl caused from incorrect selection of the resist, separation of the resist, poor resistance against breakage, leakage of the adhesive, insufficient bonding force and deterioration in the dimension accuracy. As a result, satisfactory flatness can be realized.

It is preferable that the flexible printed circuit board 1 having the protective layer according to the present invention is structured as follows: the difference between the coefficient of linear thermal expansion of the polyimide resin for constituting at least either of the first polyimide-resin layer 3 or the second polyimide-resin layer 5 and that of the copper foil 2 subjected to the heat treatment, such as the imidation, is $2.0 \times 10^{-6}/K$ to $10.0 \times 10^{-6}/K$. More preferably, it is preferable that the difference is $2.0 \times 10^{-6}/K$ to $5.0 \times 10^{-6}/K$.

The reason for this is that the coefficient of linear thermal expansion of the copper foil 2 is enlarged by about $2.0 \times 10^{-6}/K$ after it has subjected to the heat treatment, such as the imidation. If the difference between the coefficient of linear thermal expansion of the polyimide resin for forming the first and second polyimide resin layers 3 and 5 and that of the copper foil 2 is $10.0 \times 10^{-6}/K$ or larger, forming of the curl cannot satisfactorily be prevented. Moreover, a required flatness cannot be realized.

The difference of the coefficient of linear thermal expansion of the polyimide resin from that of the coefficient of linear thermal expansion of the copper foil 2 must be $2 \times 10^{-6}/K$ to $10 \times 10^{-6}/K$, as described above. To realize this, it is preferable that the coefficient of linear thermal expansion of each polyimide resin for constituting the first and second polyimide resin layers 3 and 5 according to the present invention is $20 \times 10^{-6}/K$ to $30 \times 10^{-6}/K$, more preferably $21 \times 10^{-6}/K$ to $24 \times 10^{-6}/K$ As described above, the flexible printed circuit board 1 having the protective layer according to the present invention has the structure that the coefficient of linear thermal expansion of the copper foil 2 and that of the polyimide resin for constituting each of the first and second polyimide resin layers 3 and 5 are made to be the same as much as possible. As a result, amounts of thermal expansion and thermal contraction are substantially the same between the conductors. It leads to a fact that the accuracy of the pattern of a precise circuit and flatness of the precise circuit can be improved. Moreover, formation of the curl can furthermore efficiently be prevented. Therefore, heat resistance can furthermore be improved.

The polyimide resin for constituting the first and second polyimide resin layers 3 and 5 which satisfy the above-mentioned coefficient of linear thermal expansion is prepared by turning, into an imide, the polyamic acid which is the condensation compound of the following acid dihydrate and the aromatic diamine.

The acid dihydrate may be any one of the following materials: pyromellitic acid dihydrate; biphenyl tetra carboxylic acid dihydrate; bis (3,4-dicarboxyphenyl) sulfonic acid dihydrate; bis (3,4-dicarboxyphenyl) ether dihydrate; or benzophenone tetracarboxylic acid dihydrate.

The diamine may be any one of the following materials: p-phenylene diamine; 4,4 diaminodiphenyl ether; 2,2-bis [4-(4-aminophenoxy)phenyl]propane; 2,2-bis [4-(4-aminophenoxy) phenyl]sulfone; 4,4-diaminobenzanilide; or 1,4-bis (4-aminophenoxy) benzene.

The polyimide resin for constituting the first and second polyimide resin layers 3 and 5 according to the present invention is not limited to the foregoing materials. Since the land portion, that is the terminal portion 2a, is formed by an etching process using strong alkali solution and hot water, the polyimide resin to serve as the insulating protective layer must easily be dissolved by the strong alkali solution in a state in which the polyimide resin is the polyamic acid which is the precursor. From the foregoing viewpoint, it is preferable that a combination is employed which includes pyromellitic acid dihydrate which can easily be dissolved at relatively low temperatures.

It can be considered that a carboxylic group of the polyamic acid which is the condensation compound of the acid dihydrate and the diamine corrodes the copper foil 2 is the conductor. Therefore, a rust-preventive agent may be added to the polyamic acid. The rust-preventive agent is able to improve the bonding strength of the interface of the copper foil 2.

The rust-preventive agent is exemplified by a triazole compound, such as 3-(N-salicyloyl) amino-1,2,3-triazole; an imidazole compound, such as 2-methylmidazole; and its salt. It is preferable that the rust-preventive agent is added by 1 wt % to 10 wt % with respect to 100 wt % of the polyamic acid.

The coefficient of linear expansion of the polyimide resin for constituting the first and second polyimide resin layers 3 and 5 can arbitrarily be adjusted as disclosed in Japanese Patent Laid-Open No. 60-157286, Japanese Patent Laid-Open No. 60-243120, Japanese Patent Laid-Open No. 63-239998, Japanese Patent Laid-Open No. 1-245586, Japanese Patent Laid-Open No. 3-123093 and Japanese Patent Laid-Open No. 5-1390527. That is, the combination of the acid dihydrate and the aromatic diamine, their chemical structures and the mixture ratio are changed to perform the adjustment.

The flexible printed circuit board having the protective layer according to the present invention is not limited to the structure as shown in FIG. 3. That is, the structure is not limited to the foregoing structure in which each of the first and second polyimide resin layers 3 and 5 has a single-layer structure. A structure as shown in FIG. 4 may be employed in which the polyimide resin has a mutli-layer structure. In the foregoing case, it is preferable that each of the polyimide resin layer has a multi-layer structure having three or less number of layers. If the number of the layers is not less than four, the cost is excessively raised. If the number of the polyimide resin layer is one, complete prevention of the curl cannot be performed. However, the foregoing structure may be employed depending on the purpose of the circuit. Therefore, it is preferable that the number of the polyimide layers is three or less.

Another structure of the flexible printed circuit board 10 having the protective layer as shown in FIG. 4 may be employed. That is, the flexible printed circuit board 6 includes three polyimide resin layers 3a, 3b and 3c laminated on the copper foil 2. Moreover, three polyimide resin layers 5a, 5b and 5c serving as the insulating protective layer 7 are formed on the copper foil 2. It is preferable that the coefficient of linear thermal expansion of the polyimide resin layer 3a adjacent to the copper foil 2 and that of the outer polyimide resin layer 3c are larger than that of polyimide resin layer 3b which is an intermediate layer between the polyimide resin layers 3a and 3c. That is, the polyimide resin layer 3a adjacent to the copper foil 2 and the outer polyimide resin layer 3c are the polyimide resin layers each having a large coefficient of linear thermal expansion. Moreover, the polyimide resin layer 3b which is the intermediate layer is the polyimide resin layer having a small coefficient of linear thermal expansion. It is preferable that the difference between the coefficient of linear thermal expansion of each of the polyimide resin layers 3a and 5a adjacent to the copper foil 2 and the outer polyimide resin layers 3c and 5c and that of the polyimide resin layers 3b and 5b formed at the central portion is not larger than $3 \times 10^{-6}$/K. As a result of the foregoing structure, the bonding strength with the copper foil 2 can be enlarged. Moreover, a curl of the flexible printed circuit board 6 can be prevented.

It is preferable that the coefficient of linear thermal expansion of each of the polyimide resin layers 3a and 5a adjacent to the copper foil 2 is somewhat larger than that of the outer polyimide resin layers 3c and 5c. The reason for this is that the roughness of the copper foil 2 exerts an influence on the formation of the curl.

Since the polyimide resins are formed into the multi-layer structures as described above, the coefficient of linear thermal expansion can be adjusted to a value approximating that of the copper foil. As a result, the curl can effectively be prevented. When the thickness of the polyimide resin of the layers outside the copper foil 2 is adjusted, the curl formation can be controlled.

To prevent separation of the polyimide resin for forming the multi-layer structure by enlarging the bonding force, epoxy resin may be added. The epoxy resin may be general-purpose epoxy resin, such as bisphenol A or novolak phenol. Although the hardening material made of the epoxy resin is not necessarily required, the epoxy resin may be added to the polyamic acid solution.

Similar to the case of the first and second polyimide resin layers 3 and 5 each having the single-layer structure, it is preferable that the difference of the coefficient of linear thermal expansion of the polyimide resin layer for constituting the multi-layer structure from the coefficient of linear thermal expansion of the copper foil 2 is $2 \times 10^{-6}$/K to $10 \times 10^{-6}$/K, more preferably $2 \times 10^{-6}$/K to $5 \times 10^{-6}$/K.

The coefficient of linear thermal expansion of each polyimide resin for constituting the polyimide resin layer having the multi-layer structure must be $20 \times 10^{-6}$K to $55 \times 10^{-6}$/K. It is preferable that the coefficient of linear thermal expansion is $20 \times 10^{-6}$/K to $30 \times 10^{-6}$/K, more preferably $21 \times 10^{-6}$/K to $24 \times 10^{-6}$/K If the coefficient of linear thermal expansion of the polyimide resin forming each layer is smaller than $20 \times 10^{-6}$/K, satisfactory bonding strength with respect to the copper foil 2 cannot be obtained after the resin has been applied to the copper foil 2. If the coefficient of linear thermal expansion of the polyimide resin forming each layer is larger than $55 \times 10^{-6}$/K, the polyimide resin layer which satisfies the requirement that the difference from the coefficient of linear thermal expansion of the copper foil 2 must be $2.0 \times 10^{-6}$/K to $10.0 \times 10^{-6}$/K cannot be formed.

If a circuit permitting a small thickness of the layer is formed, the second polyimide-resin layer 5 serving as the insulating protective layer is formed by applying polyamic acid having a coefficient of linear thermal expansion which is different from that of the copper foil 2 after the imidation by $2.0 \times 10^{-6}$/K to $10.0 \times 10^{-6}$/K, preferably $2.0 \times 10^{-6}$/K to $5.0 \times 10^{-6}$/K to form a single layer. Usually, the thickness of the second polyimide-resin layer 5 is 3 $\mu$m to 10 $\mu$m. If the thickness is not larger than 3 $\mu$m, voltage resistance becomes unsatisfactory. If the thickness is not smaller than 10 $\mu$m, application to form a single layer causes a curl to be formed. Therefore, when a thickness of 10 $\mu$m or larger is realized, two or more layers are formed by application. That is, the thickness of the outer layer is used to control the curl.

A method of manufacturing the flexible printed circuit board according to the present invention and having the above-mentioned structure will now be described with reference to the drawings. A flexible printed circuit board having the protective layer and incorporating polyimide resin layers each having a single-layer structure will now be described as an example with reference to FIG. 3 and ensuing drawings. Note that also the flexible printed circuit board having the protective layer and incorporating polyimide resin layers each having a multi-layer structure, as shown in FIG. 4, can be manufactured by laminating the polyimide resin layers.

Figure 5:
FIG. 5 is a cross sectional view showing a step of a process for manufacturing the flexible printed circuit board having a protective layer according to the present invention.

When the second polyimide-resin layer 5 is manufactured, the copper foil 2 which is a conductor as shown in FIG. 5 is prepared.

Then, the polyamic acid solution which is a precursor for the polyimide resin layer, which will be formed on the copper foil 2, is prepared as follows.

The polyamic acid solution is prepared by causing acid dihydrate and the aromatic diamine to react with each other in polar solvent. Since the foregoing reaction is a heat generating reaction, the solution is cooled down to control the reaction if necessary. In general, the reaction is performed at about 0° C. to about 90° C., preferable about 5° C. to 50° C. If the viscosity of the solution is too high, the viscosity can be lowered by performing heat treatment at a temperature near 90° C.

At this time, acid dihydrate and the aromatic diamine may simultaneously be added. As an alternative to this, either of the two materials is previously dissolved or suspended in the polar solvent, and then the other material is gradually added to cause the reaction to occur. It is preferable that the acid dihydrate and the aromatic diamine are added at the same molar ratio. Either of the two components may be added in a larger quantity while a range about 10:9 to 9:10 is being satisfied. The polar solvent may be pyrolidone solvent, such as N-methyl-2-pyrolidone; acetoamide solvent, such as N, N'-dimethylacetoamide; or phenol solvent, such as cresol. From a viewpoint of safety, it is preferable that N-methyl-2-pyrolidone is employed. Moreover, xylene, toluene or ethylene glycol monoethylether may be mixed.

Thus, the polyamic acid solution which is the precursor for the polyimide resin layer can be prepared.

Figure 6:
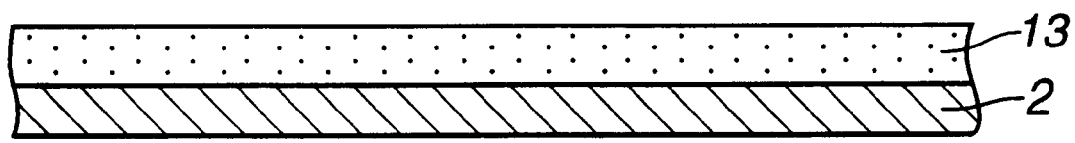
FIG. 6 is a cross sectional view showing another step of a process for manufacturing the flexible printed circuit board having a protective layer according to the present invention.

Then, the thus-prepared polyamic acid solution is, as shown in FIG. 6, applied to the surface of the copper foil 2, and then dried. Thus, the polyamic acid layer 13 is formed. At this time, the coefficient of linear thermal expansion of the polyamic acid solution, which is applied to the surface of the copper foil 2, is $20 \times 10^{-6}$/K to $30 \times 10^{-6}$/K, more preferably $21 \times 10^{-6}$/K to $24 \times 10^{-6}$/K after the imidation has been completed.

The polyamic acid solution is applied by a known industrial method using a knife coater incorporating a blade, a comma coater, a gravure coater or a wire coater. The drying process is performed at temperatures at which a bubble is not formed owning to splash of the solvent. The temperature is not limited particularly.

When the multi-layer structure having the polyimide resin layers 3a, 3b and 3c as shown in FIG. 4 is manufactured, a process for applying the polyamic acid solution to the layer applied with the polyamic acid solution is sequentially repeated.

Specifically, the layer composed of the applied polyamic acid solution is adjusted such that the residual quantity of the solvent in the layer is 50 wt % to 80 wt % after the solution has been dried. If the residual quantity of the solvent is 50 wt % or smaller, splitting occurs from the applied and laminated interface. When N-methyl-2-pyrolidone is used as the polar solvent for the polyamic acid solution, the highest temperature must be 170° C. to make the residual quantity of the solvent to be 80 wt % or smaller because the boiling point of the N-methyl-2-pyrolidone is 204° C.

After the polyamic acid solution has been applied to form a multilayer, the overall residual quantity of the solvent of the layers in the form of the multilayer polyamic acid solution is made to be 0% by drying the solution at 230° C. Note that a portion of the polyamic acid solution is turned into an imide. To finally obtain the polyimide resin layer, the overall portion of which has been turned into an imide to a required level, the following heating process is performed to turn the solution into an imide.

Figure 7:
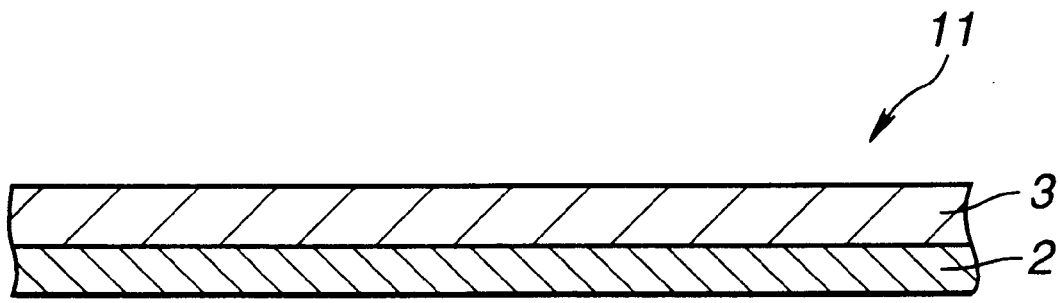
FIG. 7 is a cross sectional view showing another step of a process for manufacturing the flexible printed circuit board having a protective layer according to the present invention.

Then, the polyamic acid layer 13 is subjected to the heat treatment at 280° C. to 350° C. so that the polyamic acid layer 13 is turned into an imide. Thus, as shown in FIG. 7, the first polyimide-resin layer 3 having an imidation ratio of 80% is formed. As a result, a flexible printed board 11 can be obtained.

The surface of the thus-obtained flexible printed board 11 is not required to be flat to an extent with which an influence is not exerted on the process for forming the circuit. When the surface of the copper foil 2 is allowed to face upwards, a somewhat projecting curl enables contraction occurring when the second polyimide-resin layer 5, which is the insulating protective layer, is formed and when the imidation is performed to be absorbed. As a result, flatness of the flexible printed circuit board having the protective layer required to finally be obtained can be realized. It is preferable that the size of the projecting curl is such that the curvature radius of a sample having a size 100 mm×100 mm is 100 mm or greater.

Then, a predetermined circuit pattern is formed on the copper foil 2 of the thus-formed flexible printed board 11.

Figure 8:
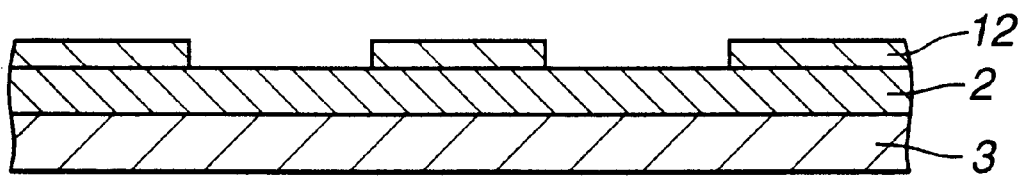
FIG. 8 is a cross sectional view showing another step of a process for manufacturing the flexible printed circuit board having a protective layer according to the present invention.

Specifically, a liquid resist is applied to the surface of the copper foil 2 of the flexible printed board 11 by a usual subtraction method, and then the liquid resist is dried. Then, the resist is irradiated with ultraviolet rays to expose a predetermined pattern to light. Then, the resist is developed. As a result, the resist portion exposed to the ultraviolet rays is removed by the developing process. Thus, as shown in FIG. 8, a resist 12 having a predetermined pattern is, as a mask, formed on the copper foil 2.

Figure 9:
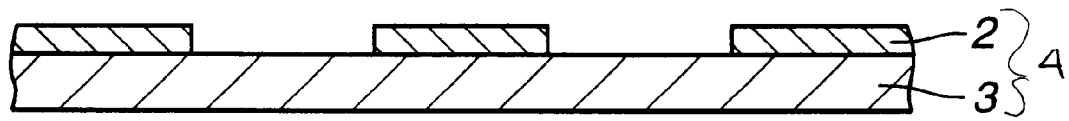
FIG. 9 is a cross sectional view showing another step of a process for manufacturing the flexible printed circuit board having a protective layer according to the present invention.

Usual etching solution, such as cupric chloride solution, is used to etch the copper foil 2 so that a required asperity pattern is formed on the copper foil 2. Then, the mask made of the resist 12 is removed so that the circuit pattern is formed on the copper foil 2, as shown in FIG. 9. As a result, the flexible printed circuit board 4 can be obtained.

Figure 10:
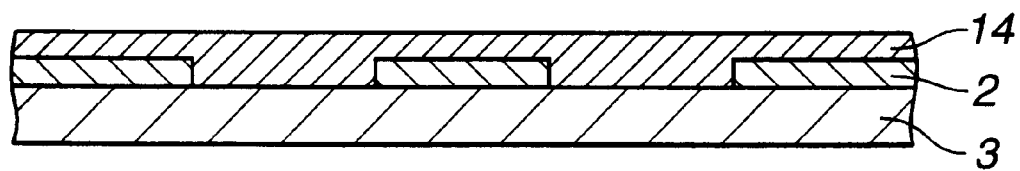
FIG. 10 is a cross sectional view showing another step of a process for manufacturing the flexible printed circuit board having a protective layer according to the present invention.

To protect the circuit pattern formed on the copper foil 2, a process similar to the process for forming the first polyimide resin layer is performed. That is, polyamic acid is applied to the surface of the flexible printed circuit board 4, and then dried. Thus, a polyamic acid layer 14 is formed, as shown in FIG. 10.

The polyamic acid layer 14 is turned into an imide. Thus, the polyamic acid layer 14 is formed into a second polyimide resin layer. The polyamic acid layer 14 is the precursor for the polyimide resin. It is preferable that the coefficient of linear thermal expansion of the polyimide resin is $21 \times 10^{-6}$/K to $24 \times 10^{-6}$/K. Moreover, the difference between the coefficient of linear thermal expansion of the foregoing polyimide resin and that of the polyimide resin for constituting the first polyimide-resin layer 3 is $3 \times 10^{-6}$/K. As described above, the polyamic acid, which satisfies the conditions about the coefficient of linear thermal expansion and with which the polyimide resin is obtained by the imidation, is used to form the polyamic acid layer 14.

Then, the polyamic acid layer 14 formed on the copper foil 2 is etched by a conventional method using alkali solution which has been performed in a plant for manufacturing semiconductors so that the land portion and the terminal portion are formed.

Figure 11:
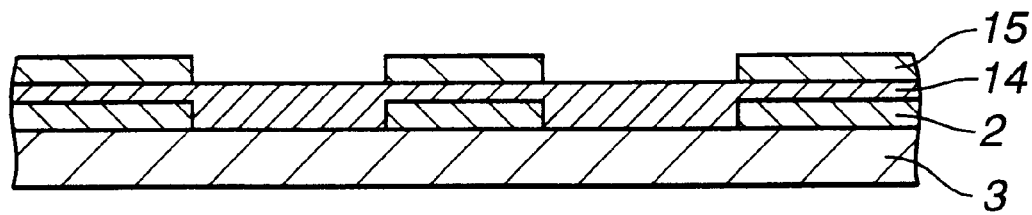
FIG. 11 is a cross sectional view showing another step of a process for manufacturing the flexible printed circuit board having a protective layer according to the present invention.

Specifically, a photoresist which can be developed with neutral solution or weak acid solution and which exhibits excellent alkali solution resistance is applied to the surface of the polyamic acid layer 14 to have a dry thickness of about 10 μm. The photoresist may be NR-41 (nylon-oligoester manufactured by Sony Chemical). A predetermined pattern is exposed to the photoresist by using a laser beam, and then the photoresist is developed. As a result, a photoresist portion to which the laser beam has been exposed is removed by the developing process. Thus, a photoresist 15 is, as a mask, formed, as shown in FIG. 11.

Figure 12:
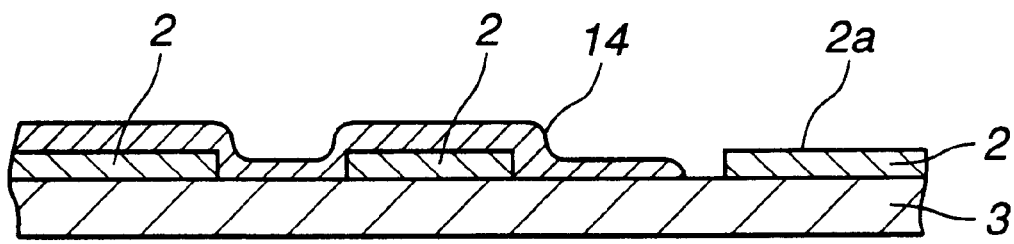
FIG. 12 is a cross sectional view showing another step of a process for manufacturing the flexible printed circuit board having a protective layer according to the present invention.

Then, the polyamic acid layer 14 is etched by using both of 10% potassium hydroxide solution and hot water. Then, the photoresist 15 is separated by strong acid solution. Thus, a terminal portion 2a is provided for the polyamic acid layer 14, as shown in FIG. 12.

Figure 13:
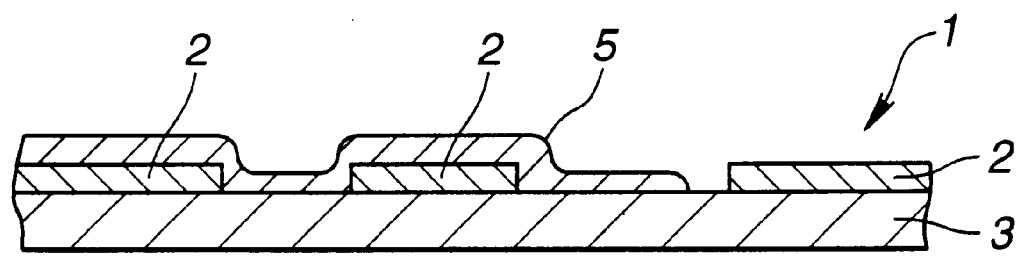
FIG. 13 is a cross sectional view showing another step of a process for manufacturing the flexible printed circuit board having a protective layer according to the present invention.
Figure 14:
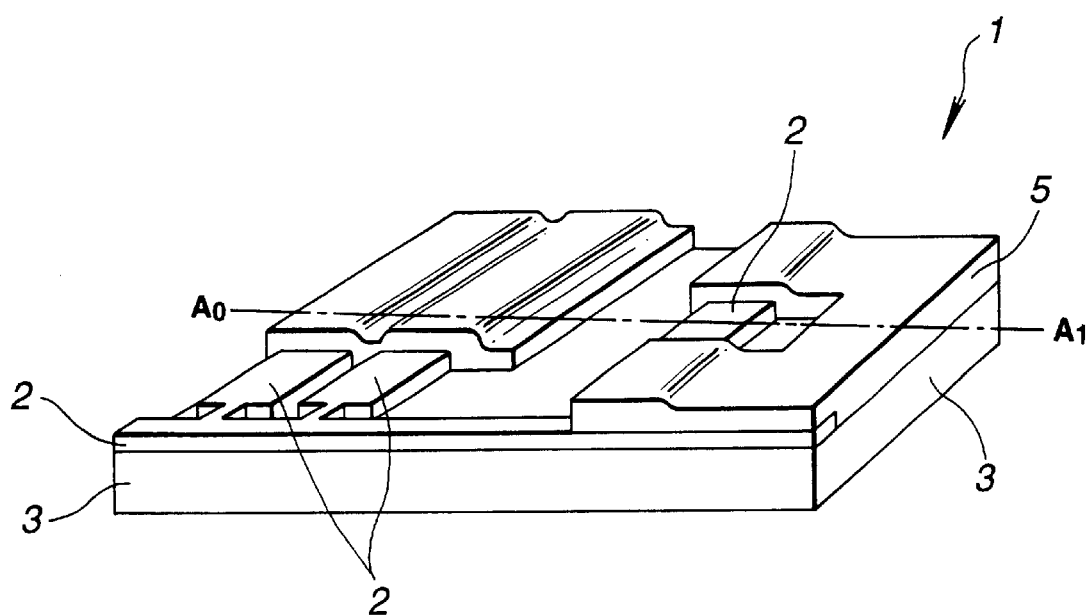
FIG. 14 is a perspective view showing the flexible printed circuit board having a protective layer according to the present invention.

Then, the polyamic acid layer 14 is subjected to heat treatment at 280° C. to 350° C. for about 30 minutes to about 120 minutes so that the polyamic acid layer 14 is turned into an imide. Thus, the second polyimide-resin layer 5 is formed, as shown in FIG. 13. It leads to a fact that the flexible printed circuit board 1 having the protective layer according to the present invention and structured as shown in FIGS. 3 and 14 can be obtained. Note that FIG. 3 is a diagram drawn by cutting along a dashed line $A_0$ to $A_1$ shown in FIG. 14.

The imidation for forming the first polyimide-resin layer 3 is performed at 250° C. to 350° C. Note that the ratio of the imidation is not required to always be 100%. Also when the imidation for forming the second polyimide-resin layer 5 to serve as the insulating protective layer is performed, the first polyimide-resin layer 3 is heated. Therefore, there is apprehension that excessive thermal energy causes deterioration in the bonding strength of the copper foil 2 to take place. Therefore, it is preferable that the imidation ratio of the first polyimide-resin layer 3 realized prior to forming the second polyimide-resin layer 5 is about 80% at which a conductor circuit can be obtained on which an influence of contraction caused from insufficient imidation is not exerted. After the polyamic acid layer 14 which is the precursor for the second imide layer has been applied, portions of the materials of the polyamic acid layer 14 and the first polyimide-resin layer 3 which have not been turned into an imide are, in a stroke, turned into an imide at 250° C. to 350° C., as shown in FIG. 13.

EXAMPLES

Examples of the present invention will now be described by using results of experiments.

Initially, polyamic acid was prepared as follows. To measure the coefficient of linear thermal expansion of polyimide resin obtained by turning the prepared polyamic acid solution into an imide, the following polyimide film was manufactured.

Experiment 1

<Preparation of Polyamic Acid Solution>

Initially, as shown in Table 1, 0.866 kg (8.00 moles) of paraphenylene diamine (PDA manufactured by Mitui Chemicals) and 1.603 kg (8.00 moles) of 4,4'-diaminodiphenyl ether (DPE manufactured by Wakayama Chemicals) were, in a 60-liter reaction vessel having a jacket and permitting temperature control, dissolved in about 44 kg of solvent which was N-methyl-pyrolidone (NMP manufactured by Mitubishi Chemicals). While gradually adding 3.523 kg (16.14 moles) of pyromellitic acid dihydrate (PMDA manufactured by Mitubishi Gas Chemicals) at 50° C., reactions were performed for three hours. Thus, polyamic acid solution containing a solid component of about 12% and viscosity at 25° C. of 20 Pa·S was obtained. The obtained polyamic acid solution was called Sample 1.

Then, the polyamic acid solution was applied to the surface of the copper foil such that the thickness of the film turned into an imide was 25 $\mu$m. Then, the solvent was allowed to fly in a continuous furnace, the temperature of which was 80° C. to 170° C., and then the temperature was raised to 230° C. to 350° C. Then, heat treatment was performed at 350° C. for 30 minutes so that the solution was turned into an imide.

Then, a portion of the copper foil was etched with cupric chloride solution so that a polyimide film was manufactured. When the coefficient of linear thermal expansion of the obtained polyimide film was measured, the coefficient of linear thermal expansion was $20\times10^{-6}$/K.

TABLE 1

| Prepared Samples | Type of Acid Dihydrate | Type of Diamine Diamine (a) | Type of Diamine Diamine (b) | Molar Ratio of Diamine (a)/(b) | Coefficient of Linear Thermal Expansion × $10^{-6}$/K |
|---|---|---|---|---|---|
| -1 | PMDA | DPE | PDA | 50/50 | 20 |
| -2 | PMDA | DPE | — | 100/0 | 31 |
| -3 | PMDA | DPE | PDA | 70/30 | 24 |
| -4 | PMDA | DPE | DABA | 75/25 | 22 |
| -5 | BPDA | DPE | — | 100/0 | 35 |
| -6 | BPDA | DPE | PDA | 50/50 | 20 |
| -7 | BPDA | DPE | DABA | 25/75 | 20 |
| -8 | PMDA | BAPP | — | 100/0 | 25 |
| -9 | DSDA | DPE | — | 100/0 | 39 |
| -10 | DSDA | BAPP | — | 100/0 | 55 |
| -11 | PMDA | DPEP | DABA | 30/70 | 12 |
| -12 | BPDA | DPE | PDA | 10/90 | 10 |

PMDA: pyromellitic acid dihydrate
BPDA: 3,4,3',4'-bisphenyl tetracarboxylic acid dihydrate
DSDA: 3,3',-4,4'-diphenyl sulfon tetracarboxylic acid dihydrate
DPE: 4,4'-diaminodiphenyl ether
PDA: paraphenylene diamine
DABA: 4,4'-diaminobenzanilide
BAPP: 2,2-bis[4-(4-aminophenoxy)phenyl]propane Experiments 2 to 12

Then, a process similar to the foregoing process was performed. Then, polyamic acid solution was prepared by changing the type of the acid dihydrate, that of diamine and the ratio of diamine as shown in Table 1. The thus-prepared polyamic acid solution was called Samples 2 to 12.

Samples 2 to 12 of the polyamic acid solution were used to manufacture polyimide films by a process similar to the foregoing process. The coefficient of linear thermal expansion of each of the manufactured polyimide film was measured. Results of the measurement of the coefficient of linear thermal expansion were shown in Table 1.

The thus-obtained polyamic acid solution was used to manufacture the flexible printed circuit board.

Example 1

<Manufacturing of Flexible Printed Board and Flexible Printed Circuit Board>

Initially, electrolytic copper foil having a thickness of 18 $\mu$m (CF-T9-LP; trade name of Fukuda) as shown in Table 2 was prepared. Then, Sample 2 of the polyamic acid solution was applied to the surface of the copper foil to have a thickness of 3 $\mu$m. Then, the solvent was allowed to fly so that a polyamic acid layer was formed. Note that the residual quantity of the solvent was 45%.

A similar process was performed so that Sample 1 of the polyamic acid solution was applied to have a thickness of 18 $\mu$m after the polyamic acid solution was turned into an imide as shown in Table 3. The residual quantity of the residual solvent which was the total of the first and second layers was 75%.

Similarly, as shown in Table 3, Sample 2 of the polyamic acid solution was applied to the surface of the second polyamic acid layer to have a thickness of 2 $\mu$m after the polyamic acid was turned into an imide. The residual quantity of the solvent which was the total of solvent in the three layers was 70%.

Then, heat treatment was performed at 230° C. for 5 minutes. The residual quantity of the solvent was 1% or lower. Then, the temperature was raised to 350° C. in one hour in an atmosphere of nitrogen gas. Then, the material was calcinated at 350° C. for 15 minutes. Thus, flexible printed boards were manufactured.

Then, a liquid resist (RX-20; trade name of Tokyo Applied Chemicals) was applied to the surface of the copper foil of each of the manufactured flexible printed boards. Then, drying, exposure and development processes were performed. The copper foil was etched with cupric chloride solution so that a circular land having a diameter of 5 mm and a parallel circuit, the pitch of which was 100 $\mu$m and a width of which was 50 $\mu$m, were formed. Thus, flexible printed circuit boards were manufactured. Note that the foregoing pitch is a shortest pitch which can be realized by the current etching technique. That is, a circuit having the shortest pitch which was obtained by the current etching technique was formed.

TABLE 2

| Measurement No. | Type | Manufacturer | Thickness $\mu$m | Average Roughness on Center Line $\mu$m | Coefficient of Linear Thermal Expansion × $10^{-6}$/K Before Process | Coefficient of Linear Thermal Expansion × $10^{-6}$/K After Process |
|---|---|---|---|---|---|---|
| 1 | Electrolytic Copper Foil | CF-T9-LP (Fukuda) | 18 | 6.5 | 16.3 | 19.0 |
| 2 | Electrolytic Copper Foil | SLP-35 (Nihon Denkai) | 35 | 9.0 | 16.5 | 18.0 |

TABLE 2-continued

| Measurement No. | Type | Manufacturer | Thickness μm | Average Roughness on Center Line μm | Coefficient of Linear Thermal Expansion × $10^{-6}$/K Before Process | Coefficient of Linear Thermal Expansion × $10^{-6}$/K After Process |
|---|---|---|---|---|---|---|
| 3 | Electrolytic Copper Foil | NCWS (Furukawa Circuit Foil) | 10 | <1.0 | 17.5 | 19.5 |
| 4 | Rolled Copper Foil | BHY-028 (Nikko Glued Foil) | 18 | 3.0 | 18.0 | 20.0 |

TABLE 3

| Comparative Examples of Copper Foil | Polyimide Resin Copper Film Layer | | | | | | Polyimide Resin Protective Layer | | | | | |
|---|---|---|---|---|---|---|---|---|---|---|---|---|
| | First Layer from Copper Foil | | Second Layer From Copper Foil | | Third Layer from Copper Foil | | First Layer from Copper Foil | | Second Layer from Copper Foil | | Third Layer from Copper Foil | |
| | Sample No. | Thickness μm | Sample No. | Thickness μm | Sample No. | Thickness μm | Sample No. | Thickness μm | Sample No. | Thickness μm | Sample No. | Thickness μm |
| Example 1 | 1 | 2 | 3 | 1 | 18 | 2 | 4 | 2 | 3 | 1 | 18 | 2 | 4 |
| Example 2 | 1 | 2 | 3 | 1 | 10 | 2 | 2 | 2 | 3 | 1 | 10 | 2 | 2 |
| Example 3 | 2 | 2 | 3 | 1 | 10 | 2 | 2 | 2 | 3 | 1 | 10 | 2 | 2 |
| Example 4 | 3 | 2 | 3 | 1 | 10 | 2 | 2 | 2 | 3 | 1 | 10 | 2 | 2 |
| Example 5 | 4 | 2 | 3 | 1 | 10 | 2 | 2 | 2 | 3 | 1 | 10 | 2 | 2 |
| Example 6 | 1 | 3 | 3 | 1 | 10 | 3 | 2 | 2 | 3 | 1 | 10 | 2 | 2 |
| Example 7 | 4 | 5 | 3 | 1 | 10 | 5 | 2 | 3 | 3 | 1 | 10 | 3 | 2 |
| Example 8 | 4 | 5 | 3 | 6 | 10 | 5 | 2 | 5 | 3 | 1 | 10 | 5 | 2 |
| Example 9 | 4 | 10 | 3 | 1 | 10 | 10 | 2 | 5 | 3 | 6 | 10 | 5 | 2 |
| Example 10 | 1 | 2 | 3 | 4 | 18 | 2 | 4 | 10 | 3 | 1 | 10 | 10 | 2 |
| Example 11 | 4 | 5 | 3 | 7 | 20 | 2 | 5 | 2 | 3 | 4 | 18 | 2 | 4 |
| Example 12 | 1 | 9 | 3 | 7 | 20 | Not Formed | | 2 | 3 | 7 | 15 | Not Formed | |
| Example 13 | 3 | 8 | 15 | Not Formed | | Not Formed | | 9 | 3 | 7 | 20 | Not Formed | |
| Example 14 | 1 | 2 | 3 | 1 | 18 | 2 | 4 | 8 | 15 | Not Formed | | Not Formed | |
| Example 15 | 3 | 2 | 3 | 1 | 8 | 2 | 4 | 3 | 15 | Not Formed | | Not Formed | |
| Example 16 | 3 | 3 | 3 | 1 | 12 | Not Formed | | 2 | 8 | Not Formed | | Not Formed | |
| Example 17 | 2 | 2 | 3 | 11 | 10 | 2 | 4 | 1 | 7 | Not Formed | | Not Formed | |
| Example 18 | 2 | 5 | 3 | 12 | 18 | 5 | 4 | 2 | 2 | 11 | 10 | Not Formed | |
| Comparative Example 1 | 1 | 10 | 3 | 1 | 18 | 10 | 4 | 5 | 3 | 12 | 18 | Not Formed | |
| Comparative Example 2 | 1 | 10 | 15 | Not Formed | | Not Formed | | Formation Impossible | | Formation Impossible | | Formation Impossible | |
| Comparative Example 3 | 1 | 11 | 15 | Not Formed | | Not Formed | | Formation Impossible | | Formation Impossible | | Formation Impossible | |
| Comparative Example 4 | 1 | 2 | 3 | 1 | 10 | 2 | 2 | Formation Impossible | | Formation Impossible | | Formation Impossible | |
| Comparative Example 5 | 2 | 5 | 3 | 12 | 10 | 5 | 2 | | | | | | |

TABLE 3-continued

| | | | | |
|---|---|---|---|---|
| Comparative Example 4 | 2 | 8 | Not Formed | Not Formed |
| Comparative Example 5 | 12 | 8 | Not Formed | Not Formed |

The thus-obtained flexible printed circuit boards were subjected to the following evaluation tests. Results were shown in Table 4.

Method of Evaluation Test

1. Measurement of Coefficient of Linear Thermal Expansion

A thermal mechanical analyzer (TMA/SCC 15CU manufactured by S11) was operated to pull the samples under a load of 2.5 gr to 5.0 gr so as to measure the coefficient of linear thermal expansion in accordance with measurement data in a temperature range of 100° C. to 350° C.

2. Measurement of Imidation Ratio

Infrared-ray absorption analysis was performed such that amounts of absorbed light of imide groups each having an absorbing wavelength of 1780 $cm^{-1}$ were calculated in accordance with the percentage of the imide groups with respect to the amount of absorption after the samples were turned into an imide at 100%.

3. Measurement of Curls

The flexible printed circuit board was cut to have a size 100 mm×100 mm. The curvature radius was calculated from the average height of the four corners when the flexible printed circuit board was placed on a horizontal plate such that the flexible printed circuit board faced downward.

<Manufacturing of Flexible Printed Circuit Board having Protective Layer>

Then, a second polyimide resin layer serving as the insulating protective layer was formed between parallel conductors formed at pitches of 100 $\mu$m of the foregoing flexible printed circuit board. Specifically, samples shown in Table 3 were used to form the second polyimide resin layer so that triple-layer polyamic acid layers having the thicknesses shown in Table 3 were formed.

Then, each of the triple-layer polyamic acid layer formed on the copper foil was etched by using 10% potassium hydroxide solution and hot water so that a land portion and a terminal portion were formed.

Finally, each of the polyamic acid layer was subjected to heat treatment at 280° C. to 350° C. for about 30 minutes to 120 minutes. Thus, the polyamic acid layer was turned into an imide. Thus, the flexible printed circuit board having the protective layer according to this embodiment was formed which had the second polyimide resin layer serving as the insulating protective layer.

Also the coefficient of linear thermal expansion of the insulating protective layer was measured by a method similar to the measurement of the coefficient of linear thermal expansion of the flexible printed circuit board in a state before the insulating protective layer was formed. To perform the measurement, polyimide films corresponding to the insulating protective layers were manufactured so that the measurement was performed. Results were shown in Table 4.

The thus-manufactured flexible printed circuit board having the protective layers were subjected to the following evaluation tests. Results of the measurement were shown in Table 4.

Method of Evaluation Tests

4. The overall body of the flexible printed circuit board having the protective layer was visually confirmed to evaluate existence of a curl. Moreover, local contraction and swelling occurring in the conductor portions and portions among the conductors of the flexible printed circuit board was visually confirmed to evaluate the flatness.

5. Measurement of Pitch in Circuit

A 3D measuring machine was operated to measure the width of each conductor and the interval of the conductors.

6. Evaluation of Electrical Reliably

The conductor portion of the manufactured flexible printed circuit board having the protective layer and a conductor portion of ITO glass were bonded to each other with an anisotropic conductive film (CP7131; trade name of Sony Chemical). Then, electrical resistance realized after the bonded portion was allowed to stand in an atmosphere of 85° C. and 85% RH was measured. Results lower than 0.5Ω were acceptable samples.

Examples 2 to 18 and Comparative Examples 1 to 5

Similarly to Example 1, flexible printed circuit boards and flexible printed circuit boards having the protective layers each of which incorporated the flexible printed circuit board were manufactured. Note that the composition and thickness of each polyimide resin layer for supporting the copper foil of the flexible printed circuit board and the polyimide resin layer serving as the insulating protective layer were made to be as shown in Table 3. Then, evaluation tests were performed similarly to Example 1.

TABLE 4

| | Copper Applied Film Layer | | | | |
|---|---|---|---|---|---|
| | | Curl | | | Coefficient of Linear Thermal Expansion $\times 10^{-8}$ |
| | Imidation Ratio % | Existence | Curvature Radius mm | Thickness $\mu$m | |
| Example 1 | 90 | Not Formed | ∞ | 25 | 24 |
| Example 2 | 92 | Not Formed | ∞ | 15 | 24 |
| Example 3 | 92 | Formed | 150 | 15 | 24 |
| Example 4 | 92.0 | Not Formed | ∞ | 15 | 24 |
| Example 5 | 90 | Formed | 400 | 15 | 24 |
| Example 6 | 90 | Formed | 500 | 15 | 22 |
| Example 7 | 90 | Formed | 100 | 15 | 25 |
| Example 8 | 85 | Not Formed | ∞ | 15 | 23 |
| Example 9 | 95 | Formed | 70 | 25 | 30 |
| Example 10 | 90 | Not Formed | ∞ | 25 | 22 |
| Example 11 | 90 | Formed | 180 | 28 | 24 |
| Example 12 | 95 | Formed | 250 | 23 | 26 |
| Example 13 | 80.0 | Formed | 300 | 15 | 25 |
| Example 14 | 90 | Not Formed | ∞ | 25 | 24 |
| Example 15 | 95.0 | Formed | 500 | 15 | 30 |
| Example 16 | 90.0 | Formed | 200 | 15 | 22 |
| Example 17 | 90 | Formed | small inverse curls | 15 | 15 |
| Example 18 | 90 | Formed | small inverse curls | 25 | 18 |

TABLE 4-continued

| | | | | | |
|---|---|---|---|---|---|
| Comparative Example 1 | 90 | Formed | Great Curls Formed | 25 | 35 |
| Comparative Example 2 | 85 | Formed | Great Curls Formed | 15 | 55 |
| Comparative Example 3 | 90 | Formed | Curl Formed | 15 | 11 |
| Comparative Example 4 | 92 | Not Formed | ∞ | 15 | 24 |
| Comparative Example 5 | 90 | Formed | Inverse Curl Formed | 5 | 18 |

| | Protective Layer | | Flexible Printed Circuit Board | | |
|---|---|---|---|---|---|
| | Thickness $\mu m$ | Coefficient of Linear Thermal Expansion $\times 10^{-8}$ | Existence of Curl | Flatness | Pitch in Circuit $\mu m$ | Electrical Reliably |
| Example 1 | 25 | 24 | Not Formed | Flat | 100 | Acceptable |
| Example 2 | 15 | 24 | Not Formed | Flat | 100 | Acceptable |
| Example 3 | 15 | 24 | Not Formed | Flat | 120 | Acceptable |
| Example 4 | 15 | 24 | Not Formed | Flat | 80 | Acceptable |
| Example 5 | 15 | 24 | Not Formed | Flat | 100 | Acceptable |
| Example 6 | 15 | 22 | Not Formed | Flat | 100 | Acceptable |
| Example 7 | 15 | 24 | Not Formed | Flat | 100 | Acceptable |
| Example 8 | 15 | 23 | Not Formed | Flat | 100 | Acceptable |
| Example 9 | 25 | 30 | Not Formed | Flat | 100 | Acceptable |
| Example 10 | 25 | 24 | Not Formed | Flat | 100 | Acceptable |
| Example 11 | 18 | 22 | Not Formed | Flat | 100 | Acceptable |
| Example 12 | 23 | 26 | Not Formed | Flat | 100 | Acceptable |
| Example 13 | 15 | 25 | Not Formed | Flat | 80 | Acceptable |
| Example 14 | 15 | 26 | Not Formed | Flat | 100 | Acceptable |
| Example 15 | 8 | 28 | Not Formed | Flat | 80 | Acceptable |
| Example 16 | 7 | 20 | Not Formed | Flat | 80 | Acceptable |
| Example 17 | 15 | 15 | Not Formed | Asperities Observed | 100 | Not Acceptable |
| Example 18 | 15 | 18 | Not Formed | Asperities Observed | 100 | Not Acceptable |
| Comparative Example 1 | Formation Impossible | | Not Formed | | Not Formed | |
| Comparative Example 2 | Formation Impossible | | Not Formed | | Not Formed | |
| Comparative Example 3 | Formation Impossible | | Not Formed | | Not Formed | |
| Comparative Example 4 | 8 | 31 | Formed | Great Asperities Formed | 100 | Not Acceptable |
| Comparative Example 4 | 8 | 35 | Formed | Great Asperities Formed | 100 | Not Acceptable |

<Results of Evaluation Tests>

As can be understood from results shown in Table 4, Examples 1 to 16 had the structure that the difference between the coefficient of linear thermal expansion of the polyimide resin layer for supporting the copper foil of the flexible printed circuit board and that of the polyimide resin layer serving as the insulating protective layer was $3 \times 10^{-6}$/K or smaller. The examples were free from any curl and contraction and swelling occurring locally in the conductor process or a portion between conductors. Moreover, satisfactory electrical reliably was realized.

Comparative Examples 3 and 4 having the structure that the difference between the coefficient of linear thermal expansion of the polyimide resin layer for supporting the copper foil of the flexible printed circuit board and that of the polyimide resin layer serving as the insulating protective layer was $3 \times 10^{-6}$/K or greater. The comparative examples encountered curls and suffered from unsatisfactory flatness and electrical reliably.

Therefore, the difference between the coefficient of linear thermal expansion of the polyimide resin layer for supporting the copper foil of the flexible printed circuit board and that of the polyimide resin layer serving as the insulating protective layer was made to be $3 \times 10^{-6}$/K. Thus, formation of a curl was prevented and satisfactory flatness and electrical reliably were realized.

As shown in Table 1, Examples 17 and 18 had the structure that the difference in the coefficient of linear thermal expansion between the polyimide resin layers was $3 \times 10^{-6}$/K or smaller. However, flatness and electrical reliability were unsatisfactory. The reason for this lies in that the coefficient of linear thermal expansion of the polyimide resin for constituting the polyimide resin layer was about $10 \times 10^{-6}$/K which was too small to obtain satisfactorily large bonding strength with respect to the copper foil. Therefore, it is preferable that the coefficient of linear thermal expansion of each polyimide resin for constituting the polyimide resin layer of the flexible printed circuit board having the copper foil is $20 \times 10^{-6}$/K to $55 \times 10^{-6}$/K, preferably $20 \times 10^{-6}$/K to $30 \times 10^{-6}$/K.

Comparative Examples 1 to 3 each having no insulating protective layer encountered great curls. Comparative Example 3 incorporating the polyimide resin layer using the polyimide resin having the small coefficient of linear thermal expansion was impossible to completely remove curls. Therefore, the insulating protective layer having the different coefficient of linear thermal expansion enables efficient removal of the curl.

As described above, the flexible printed circuit board according to the present invention is able to minimize formation of curls and obtain satisfactory flatness, realize excellent dimension stability and satisfactorily manufacture a precise and dense circuit required to reduce the size of the electronic apparatus and increase the functions.

Although the invention has been described in its preferred form and structure with a certain degree of particularity, it is understood that the present disclosure of the preferred form can be changed in the details of construction and in the combination and arrangement of parts without departing from the spirit and the scope of the invention as hereinafter claimed.

What is claimed is:

1. A flexible printed circuit board comprising:
   a conductor pattern corresponding to a predetermined circuit;
   a first polyimide-resin layer formed on a first surface of said conductor pattern for supporting said conductor pattern; and
   a second polyimide-resin layer formed on a second surface of said conductor pattern for covering and protecting the predetermined circuit, wherein
   a difference between a coefficient of linear thermal expansion of said first polyimide-resin layer and a coefficient of linear thermal expansion of said second polyimide-resin layer is $3\times10^{-6}$/K or less, and
   wherein at least one of said first polyimide-resin layer and said second polyimide-resin layer has a triple-layered structure formed by laminating a polyimide-resin layer adjacent to said conductor pattern, an intermediate polyimide-resin layer and an outer polyimide resin layer successively, wherein a coefficient of linear thermal expansion of the polyimide resin layer adjacent to said conductor pattern and a coefficient of linear thermal expansion of the outer polyimide resin layer are larger than a coefficient of linear thermal expansion of the intermediate polyimide resin layer.

2. The flexible printed circuit board according to claim 1, wherein said first and second polyimide-resin layers are polyimide resin made of imidizing a polyamic precursor as a polyamic acid.

3. The flexible printed circuit board according to claim 1, wherein a difference between a coefficient of linear thermal expansion of said conductor pattern and the coefficient of linear thermal expansion of at least one of said first polyimide-resin layer and said second polyimide-resin layer satisfies a range from $2\times10^{-6}$/K to $10\times10^{-6}$/K.

4. The flexible printed circuit board according to claim 1, wherein the coefficient of linear thermal expansion of the polyimide resin layer adjacent to said conductor pattern and the coefficient of linear thermal expansion of the outer polyimide resin layer are larger than the coefficient of linear thermal expansion of the intermediate polyimide resin layer by $2\times10^{-6}$/K to $10\times10^{-6}$/K.

5. The flexible printed circuit board according to claim 1, wherein the coefficient of linear thermal expansion of the polyimide resin layer adjacent to said conductor pattern is greater than the coefficient of linear thermal expansion of the outer polyimide resin layer.

* * * * *